United States Patent
Lee et al.

(10) Patent No.: US 7,120,045 B2
(45) Date of Patent: Oct. 10, 2006

(54) REFERENCE VOLTAGE GENERATING APPARATUS FOR USE IN A FERROELECTRIC RANDOM ACCESS MEMORY (FRAM) AND A DRIVING METHOD THEREFOR

(75) Inventors: Kang-Woon Lee, Seoul (KR); Byung-Jun Min, Yongin-si (KR); Byung-Gil Jeon, Suwon-si (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 11/038,304

(22) Filed: Jan. 19, 2005

(65) Prior Publication Data

US 2005/0174830 A1    Aug. 11, 2005

(30) Foreign Application Priority Data

Feb. 9, 2004   (KR) .................. 10-2004-0008237

(51) Int. Cl.
*G11C 11/22* (2006.01)

(52) U.S. Cl. .............................. 365/145; 365/189.09

(58) Field of Classification Search ........ 365/145, 365/189.09
See application file for complete search history.

(56) References Cited

U.S. PATENT DOCUMENTS

| 5,999,439 | A | * | 12/1999 | Seyyedy | 365/145 |
|---|---|---|---|---|---|
| 6,198,651 | B1 | | 3/2001 | Lee et al. | 365/145 |
| 6,252,793 | B1 | | 6/2001 | Allen et al. | 365/145 |
| 6,459,609 | B1 | | 10/2002 | Du | 365/145 |
| 6,498,745 | B1 | | 12/2002 | Kang et al. | 365/145 |
| 6,795,330 | B1 | * | 9/2004 | Demange et al. | 365/145 |
| 2003/0218899 | A1 | * | 11/2003 | Jeon et al. | 365/145 |

* cited by examiner

*Primary Examiner*—Michael Tran
(74) *Attorney, Agent, or Firm*—F. Chau & Associates, LLC

(57) ABSTRACT

A reference voltage generating apparatus and a driving method therefor are provided. The method of driving the reference voltage generating apparatus for supplying a reference voltage to read data from a ferroelectric memory cell including a ferroelectric capacitor and an access transistor comprises: re-storing, in a reference cell, data equal to data stored in the reference cell, in response to a first control signal, and generating a reference voltage, in the re-stored reference cell, in response to a second control signal, to compare the reference voltage with a voltage corresponding to data stored in the ferroelectric memory cell and to read the data stored in the ferroelectric memory cell. The reference cell includes a ferroelectric capacitor and an access transistor.

20 Claims, 5 Drawing Sheets

US 7,120,045 B2

REFERENCE VOLTAGE GENERATING APPARATUS FOR USE IN A FERROELECTRIC RANDOM ACCESS MEMORY (FRAM) AND A DRIVING METHOD THEREFOR

TECHNICAL FIELD

The present invention relates to a nonvolatile ferroelectric semiconductor memory device using a ferroelectric capacitor memory cell, and more particularly, to a reference voltage generating apparatus for generating a reference voltage in a read operation, and a driving method therefor.

BACKGROUND

An apparatus capable of using a large amount of memory has been pursued to overcome a refresh limit for a DRAM (Dynamic Random Access Memory). Such an apparatus, for example, a ferroelectric random access memory (FRAM), has been developed by applying a ferroelectric thin layer to a dielectric layer of a capacitor. The FRAM, which uses a ferroelectric thin layer, is a nonvolatile memory device that retains storage information when power is interrupted, has high-speed access, low power consumption and resistance against collision. Such a ferroelectric memory is typically used as a main memory device or a recording medium in various electronic equipment having file storage and detection functions such as portable computers, cellular phones, gaming devices, etc.

In the ferroelectric memory device, a memory cell, which includes a ferroelectric capacitor and an access transistor, stores logic data '1' or '0' in accordance with an electric polarization state of the ferroelectric capacitor. For example, when a voltage is applied to both ends of the ferroelectric capacitor, a ferroelectric material is polarized according to a direction of an electric field. A switching threshold voltage to which a polarization state of the ferroelectric material is changed is called a coercive voltage. To read data stored in the memory cell, a voltage is applied to generate a potential difference between both electrodes of the ferroelectric capacitor, and a state of the data stored in the memory cell is sensed by a change of a charge amount excited to a bit line.

Referring to FIG. 1, when a ground voltage, for example, Vss or 0V, is applied to a ferroelectric material and an electric field is not applied to the ferroelectric material, the ferroelectric material is not polarized. When a voltage at both ends of a ferroelectric capacitor increases in a positive direction, a polarization level or charge amount thereof increases from zero to a state point A within a positive polarization region. At the state point A, a polarization is generated in one direction and a polarization level of the state point A reaches a maximum value. At this time, a polarization level, for example, a charge amount remaining in the ferroelectric material, is indicated by +Qs. If the voltage at both ends of the capacitor is reduced to the ground voltage Vss, the polarization level is not reduced to zero but instead remains at a state point B. A charge amount remaining in the ferroelectric material, for example, a residual polarization level, is indicated by +Qr.

Next, if the voltage at both ends of the capacitor increases in a negative direction, the polarization level is changed from the state point B to a state point C within a negative charge polarization region. At the state point C, the ferroelectric material is polarized in a direction opposite the polarization direction of the state point A. This polarization level is indicated by −Qs. If the voltage at both ends of the capacitor again falls to the ground voltage Vss, the polarization level does not fall to zero, but instead remains at a state point D. This residual polarization level is indicated by −Qr. When a magnitude of the voltage applied to both ends of the capacitor again increases in a positive direction, the polarization level of the ferroelectric material is changed from the state point D to the state point A.

FIG. 2 illustrates a memory cell of a memory cell array in a general ferroelectric memory device. As shown in FIG. 2, the memory cell is composed of an access transistor N1 and a ferroelectric capacitor C1. The access transistor N1 has a source terminal and a drain terminal, which are connected between an electrode of the ferroelectric capacitor C1 and a bit line BL, and a gate terminal connected to a word line WL. One electrode of the ferroelectric capacitor C1 is connected to the access transistor N1 and the other electrode is connected to a plate line PL.

As described above with reference to FIG. 1, when a voltage for generating an electric field is applied to a ferroelectric capacitor into which a ferroelectric material was inserted between its two electrodes, a polarization direction based on a spontaneous polarization is maintained even if the electrodes are in a floating state. A surface charge of the ferroelectric material based on the spontaneous polarization is not spontaneously lost due to leakage. If a voltage is not applied to the ferroelectric capacitor in an opposite direction to bring the polarization level to zero the polarization direction remains intact.

When a voltage applied to the ferroelectric capacitor in a positive direction is removed, a residual polarization of the ferroelectric material goes to a sate indicated by +Qr. In addition, when a voltage applied to the ferroelectric capacitor in a negative direction is removed, the residual polarization of the ferroelectric material goes to a state indicated by −Qr. Assuming that the residual polarization has the +Qr state at the state point B, and its logic state indicates data '0', then when the residual polarization has a −Qr state at the state point D, its logic state indicates data '1'. Thus, a difference in a charge amount when changing from the state point A to the state point B (as indicated by voltage dQ0) is discriminated from a difference in a charge amount when changing from the state point D to the state point A (as indicated by voltage dQ1), and data stored in the memory cell is read.

To read data stored in the memory cell a specific reference voltage generating apparatus for generating a reference voltage having a voltage value at a mid level between a bit line voltage value for reading data '1' and a bit line voltage value for reading data '0' is needed to sense and amplify a voltage change excited to a bit line.

FIG. 3 illustrates a timing diagram for reading data from a main memory cell in a ferroelectric memory device having a conventional reference voltage generating apparatus.

Referring to FIG. 3, when a read operation starts, sense amplifier and complementary sense amplifier path signals SA_PATH and RSA_PATH are enabled and bit line pairs are connected to corresponding sense amplifiers. Before the read operation, main bit line and sub bit line precharge signals BL_PR and RBL_PR are enabled, precharging bit lines, a main bit line BL connected to the memory cell, and a sub bit line BLB connected to a reference cell. Then, at the same time as the start of the read operation, the main bit line and sub bit line precharge signals BL_PR and RBL_PR are disabled. A selected word line SWL0 and reference word line RSWL1 are enabled, a plate line voltage is applied to a plate line PL, and a reference plate line voltage is applied to reference plate lines RPL. Subsequently, a voltage data "1" or data "0" corresponding to data of a selected main memory cell is provided to the main bit line BL, and a reference voltage is provided to the sub bit line BLB connected to the reference cell. Then, a sense amplifier senses a voltage difference of the bit lines BL and BLB in response to a sense amplifier enable signal SAEN. When data reading is completed by the sense amplifier, the main memory cell is restored to its first data state in conformity with the read data. After the sense amplifier enable signal SAEN is applied, the complementary sense amplifier path signal RSA_PATH is disabled cutting off the sense amplifier and the sub bit line BLB, enabling the sub bit line precharge signal RBL_PR and grounding the sub bit line BLB, thereby preventing a data reverse effect for a selected reference cell.

Current methods for generating a reference voltage in a ferroelectric memory device are directed to applying a paraelectric capacitor or a ferroelectric capacitor to a reference cell. The method of applying a paraelectric capacitor having a small dielectric constant in a highly integrated memory device affects chip size because the capacitor takes up a large area. The method of applying a ferroelectric capacitor is divided into two methods. The first method uses a capacitance of a non-switching area of a hysteresis curve shown in FIG. 1. For example, the dQ0 value, is used as a reference voltage for controlling the size of the ferroelectric capacitor. The second method uses all switching capacitances and non-switching capacitances of the hysteresis curve of FIG. 1. Such methods enable the development of reduced chip sizes, but do not always supply a stabilized reference voltage having a typical ferroelectric characteristic. Thus, reducing the reliability of a memory device including the ferroelectric capacitor.

FIGS. 4 and 5 illustrate characteristic changes when using a non-switching capacitance of a ferroelectric capacitor in a reference cell. FIG. 4 illustrates a relaxation effect and FIG. 5 illustrates an imprint effect.

With reference to FIG. 4, the relaxation effect occurs when an electric field is removed from a ferroelectric capacitor having data preserved therein for a long time, e.g., for several milliseconds or more. As shown in FIG. 4, a polarization value is reduced from a state point B to a state point E at the hysteresis curve of the ferroelectric capacitor. If the relaxation effect produces a level difference in a semiconductor device, a capacitance change arises in a non-switching area causing a reference voltage level change and failure of the device.

As shown in FIG. 5, the imprint effect occurs when a ferroelectric capacitor remains in a single polarization state for a long time and its hysteresis curve moves in a direction along a voltage axis. A ferroelectric capacitor having the imprint effect has a relaxation characteristic that is different than its relaxation characteristic from before the imprint effect occurred according to the direction of movement. In other words, a relaxation amount is reduced in conformity with the movement of the hysteresis curve toward the left, changing a reference voltage of the reference cell, thus reducing the reliability of device during a read operation.

A need therefore exists for a reference voltage generating apparatus and a driving method therefore for providing a stabilized reference voltage and that reduces a relaxation effect or an imprint effect in a ferroelectric capacitor in a reference cell.

SUMMARY OF THE INVENTION

According to an aspect of the invention, a method of driving a reference voltage generating apparatus using a reference cell including a ferroelectric capacitor for supplying a reference voltage to read data from a ferroelectric memory cell including a ferroelectric capacitor and an access transistor, includes: re-storing, in the reference cell, data equal to data stored in the reference cell, in response to a first control signal; and generating a reference voltage, in the re-stored reference cell, in response to a second control signal, to compare the reference voltage with a voltage corresponding to data stored in the ferroelectric memory cell and to read the data stored in the ferroelectric memory cell.

The reference cell further comprises an access transistor, and the ferroelectric capacitor constituting the reference cell is larger than the ferroelectric capacitor constituting the ferroelectric memory cell. The reference voltage is generated in a non-switching area of the ferroelectric capacitor constituting the reference cell.

According to another aspect of the invention, an apparatus for generating a reference voltage using a reference cell for reading data of a ferroelectric memory cell including a ferroelectric capacitor and a transistor, includes a reference cell array having a plurality of reference cells each of which is composed of a ferroelectric capacitor and a transistor, a plurality of reference word lines each connected with transistors constituting the reference cells, bit lines each connected with the reference cells, reference plate lines connected to each ferroelectric capacitor constituting the reference cell array, and a reference voltage generating circuit for re-storing, in the reference cell, data equal to data stored in the reference cell, in response to a first control signal, and generating a reference voltage in the re-stored reference cell in response to a second control signal.

The transistor in the plurality of reference cells is an access transistor. The reference voltage generating circuit may further include a drive circuit for enabling or disabling the reference word line, the bit line connected to the reference cell and the reference plate line in response to a read start signal. A reference voltage generated in the plurality of reference cells is obtained when data of the ferroelectric memory cell is excited to a bit line connected to the ferroelectric memory cell and is simultaneously excited to a bit line connected to one of the plurality of reference cells.

According to another aspect of the present invention, a method of generating a stable reference voltage in a reference cell to read data from a ferroelectric memory cell comprises: storing second data in the reference cell, wherein the second data is equal to first data previously stored in the reference cell; generating the stable reference voltage in the reference cell with the second data; sensing a voltage of the ferroelectric memory cell; comparing the voltage of the ferroelectric memory cell with the stable reference voltage; and reading the data in the ferroelectric memory cell.

The ferroelectric memory cell includes a ferroelectric capacitor and an access transistor. The reference cell includes a ferroelectric capacitor and an access transistor. The ferroelectric capacitor in the reference cell is larger than the ferroelectric capacitor in the ferroelectric memory cell. The voltage of the ferroelectric memory cell is sensed, the voltage of the ferroelectric memory cell is compared with the stable reference voltage, and the data in the ferroelectric memory cell is read by a sense amplifier. The stable reference voltage reduces one of an imprint effect and a relaxation effect of the reference cell.

BRIEF DESCRIPTION OF THE DRAWINGS

Exemplary embodiments of the invention are described with reference to the accompanying drawings, of which.

DETAILED DESCRIPTION OF EXEMPLARY EMBODIMENTS OF THE INVENTION

Figure 6:
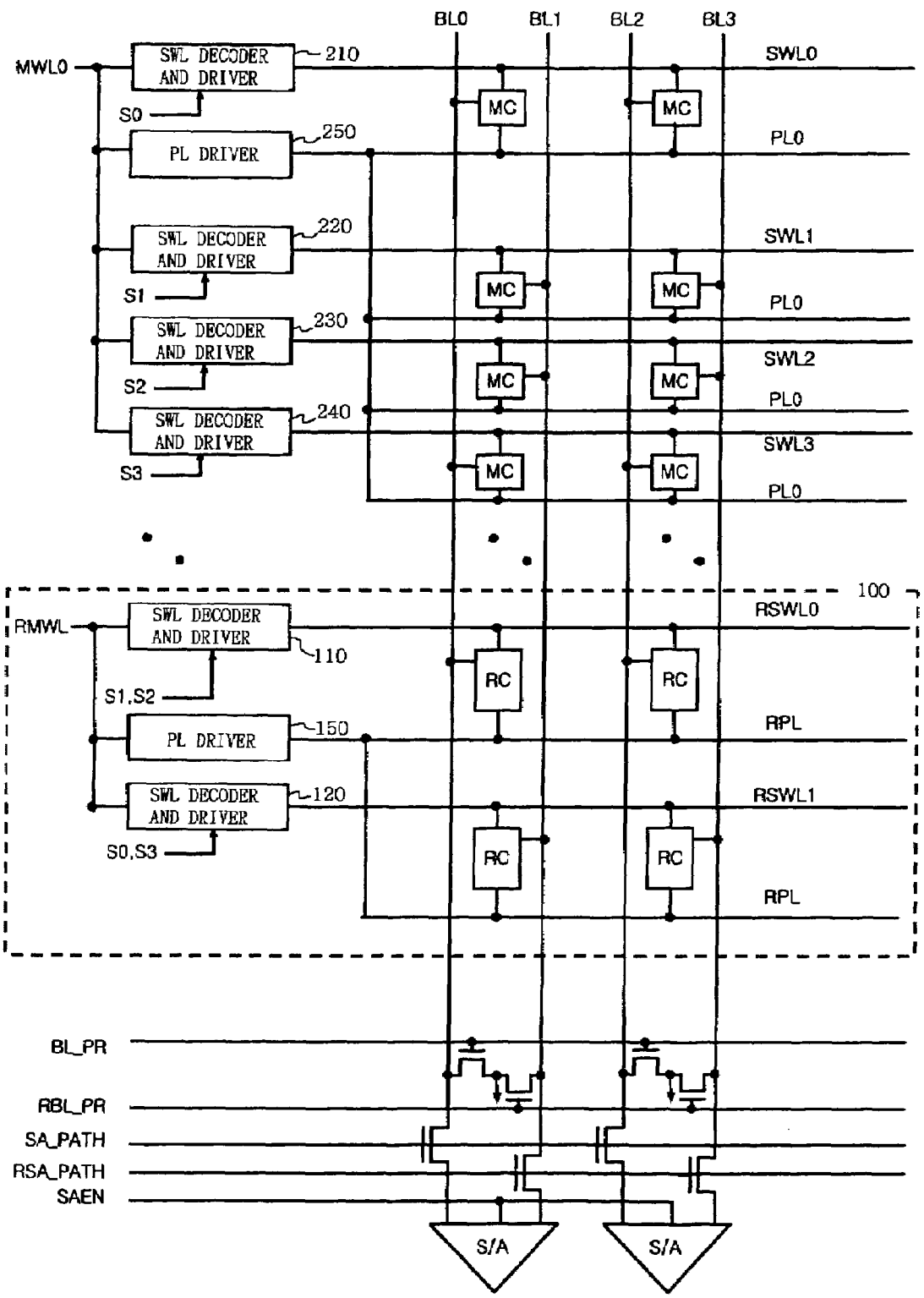
FIG. 6 is a ferroelectric memory device according to an exemplary embodiment of the invention.

FIG. 6 illustrates a ferroelectric memory device provided with a reference voltage generating apparatus 100 according to an exemplary embodiment of the invention.

Referring to FIG. 6, the ferroelectric memory device includes a main memory cell array having a plurality of ferroelectric memory cells MC, the reference voltage generating apparatus 100 and sense amplifiers S/A.

Figure 2:
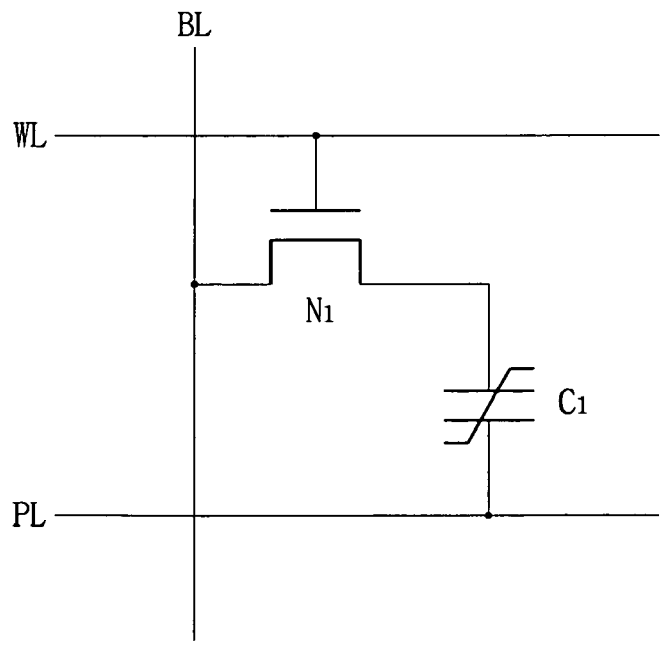
FIG. 2 is a circuit diagram of a memory cell of a general ferroelectric memory cell array.
Figure 3:
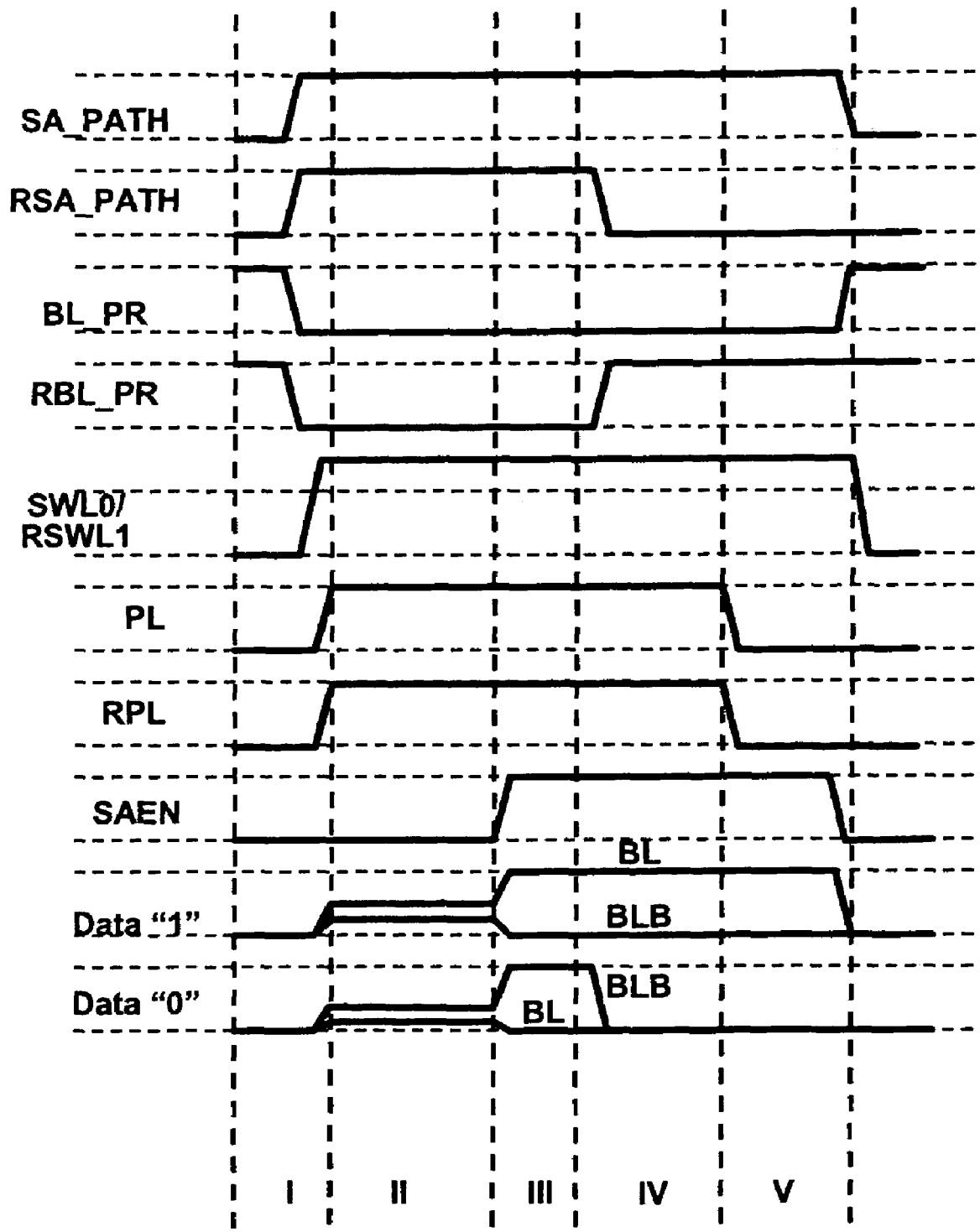
FIG. 3 is a timing diagram for a read operation in a ferroelectric memory device having a conventional reference voltage generating apparatus.
Figure 4:
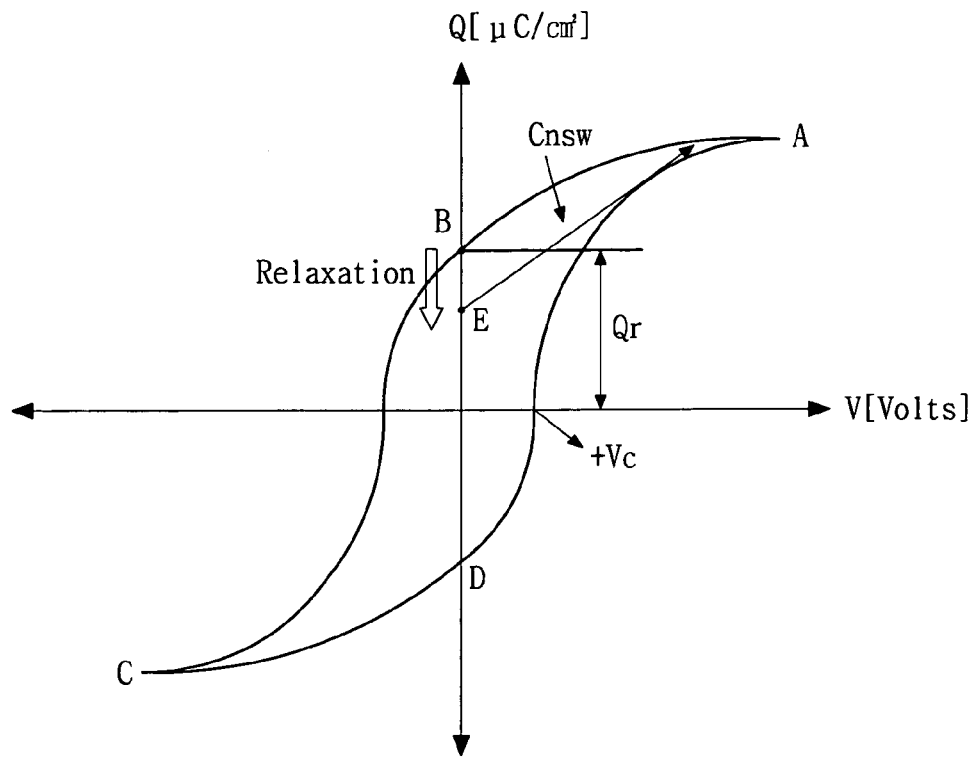
FIG. 4 is a hysteresis curve illustrating a relaxation effect.
Figure 5:
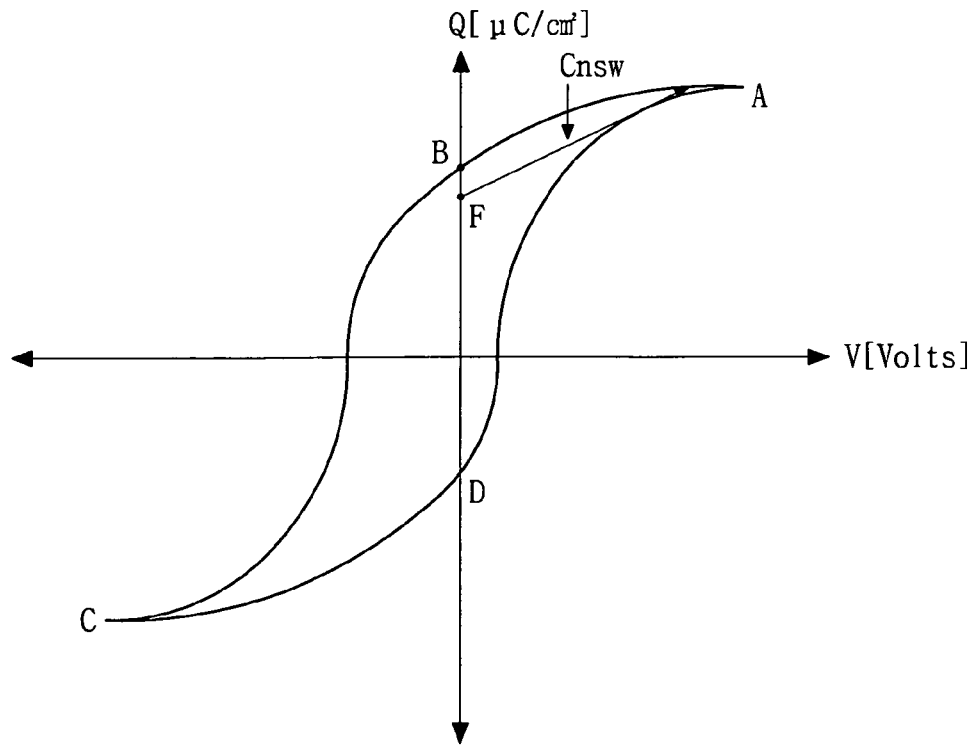
FIG. 5 is a hysteresis curve illustrating an imprint effect.

The main memory cell array is constructed of the plurality of memory cells MC having a structure that is the same as or similar to those shown in FIG. 2. The memory cells MC are constructed of one ferroelectric capacitor C1 and one access transistor N1 and are arrayed at crossed points of rows and columns of the main memory cell array. An access transistor N1 of each memory cell MC is connected to one of word lines SWL0, SWL1, SWL2 or SWL3. One end of the ferroelectric capacitors C1 of each memory cell MC is connected to a plate line PL0, and another end of the ferroelectric capacitors C1 of each memory cell MC is connected to bit lines BL0, BL1, BL2 and BL3 through the access transistors N1.

The word lines SWL0, SWL1, SWL2 and SWL3 detect word line selection signals S0, S1, S2 and S3 and are connected to respective word line decoder and driver circuits 210, 220, 230 and 240 for enabling the word lines SWL0, SWL1, SWL2 and SWL3. The word line decoder and driver circuits 210, 220, 230 and 240 are commonly connected to a main word line signal MWL0. The plate lines PL0 are commonly connected to a plate line driver circuit 250 for providing a plate line voltage to the plate lines PL0 in response to a plate enable signal.

The reference voltage generating apparatus 100 is constructed of a reference voltage generating circuit including a reference cell array, reference word line decoder and driver circuits 110 and 120, and a reference plate line driver 150. A reference cell RC of the reference cell array is constructed of one ferroelectric capacitor and one access transistor, and has a structure that is the same as or similar to one of the memory cells MC. A ferroelectric capacitor constituting a reference cell RC has a capacitance that is larger than a ferroelectric capacitor constituting the memory cell MC.

The reference cell array is configured by arranging reference cells RC having a structure that is the same as or similar to one of the main memory cells MC at cross points of rows and columns of the reference cell array. A transistor of each reference cell RC is connected to respective reference word lines RSWL0 and RSWL1. One end of the ferroelectric capacitor of each reference cell RC is connected to a reference plate line RPL, and another end of the ferroelectric capacitor of each reference cell RC is connected to the bit lines BL0, BL1, BL2 and BL3 through an access transistor.

The reference word line decoder and driver circuits 110 and 120 are connected to reference word lines RSWL0 and RSWL1 to enable the reference word lines RSWL0 or RSWL1 selected in response to a reference main word line signal RMWL and one of the word line selection signals S0, S1, S2 or S3. For example, when the reference main word line signal RMWL is applied high "H" and the word line selection signal S0 or S3 is selected, the reference word line decoder and driver circuit 120 enables the reference word line RSWL1.

The reference plate line driver circuit 150 provides a reference plate line voltage having a given level to the reference plate lines RPL in response to a read start signal and a reference voltage generation signal.

The sense amplifiers S/A are connected to the bit lines BL0, BL1, BL2 and BL3 that are commonly connected to the main memory cells MC and reference cells RC, and compare and sense a bit line voltage level connected to one of the main memory cells MC and a reference bit line voltage level connected to one of the reference cells RC, thereby reading data of a selected main memory cell MC. The sense amplifiers S/A are connected to a negative channel metal oxide semiconductor (NMOS) transistor that connects one of the sense amplifiers S/A with one of the bit lines BL0, BL1, BL2 and BL3 in response to a sense amplifier path signal SA_PATH or a complementary sense amplifier path signal RSA_PATH.

Figure 7:
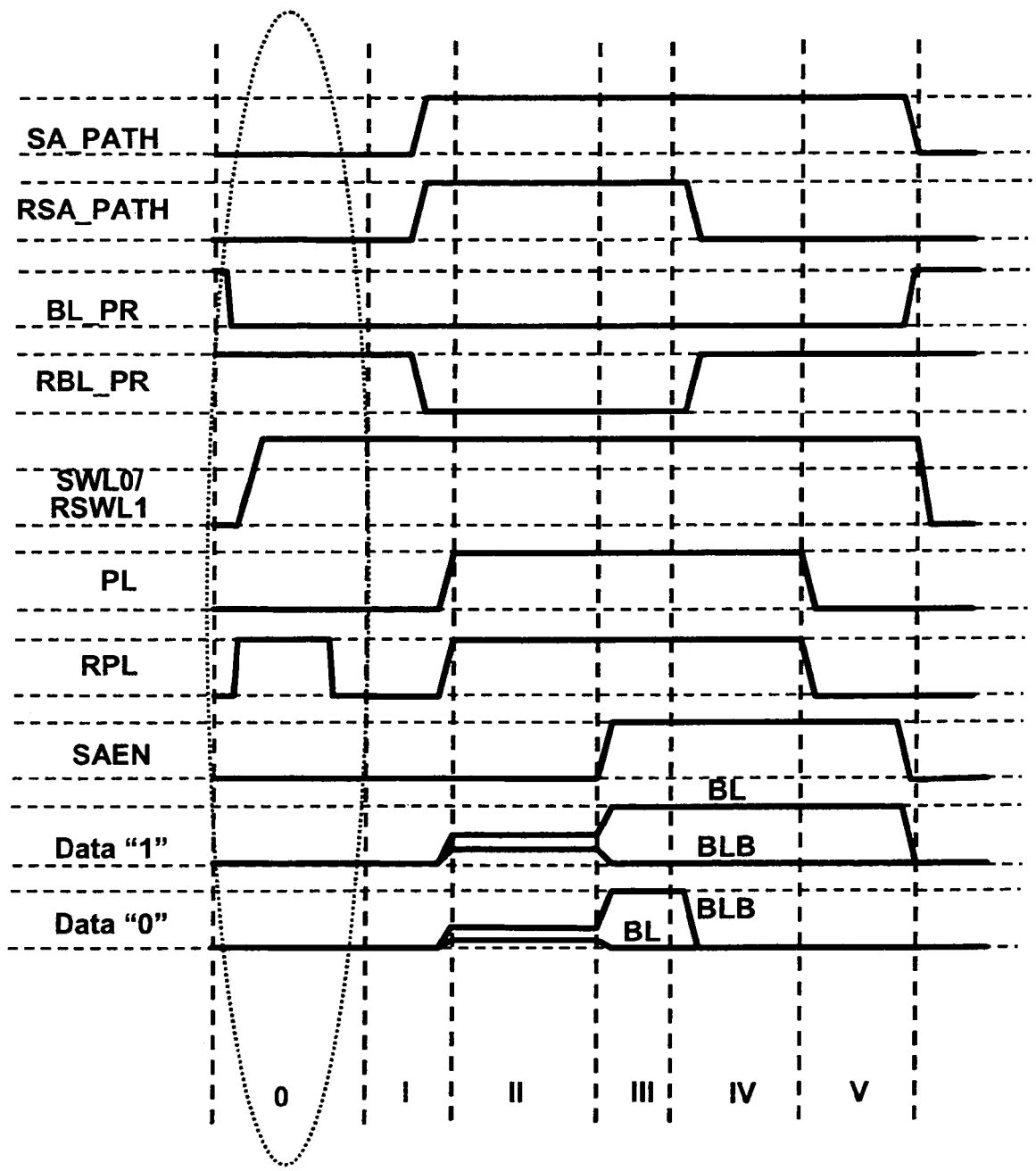
FIG. 7 is a timing diagram illustrating a read operation of the ferroelectric memory device of FIG. 6.

FIG. 7 is a timing diagram for a read operation of the ferroelectric memory device including the reference voltage generating apparatus 100 according to an exemplary embodiment of the invention.

With reference to FIGS. 6 and 7, a read operation of the ferroelectric memory device will be described as follows. In FIGS. 6 and 7, the bit lines BL0, BL1, BL2 and BL3 connected to the memory cells MC and reference cells RC are grounded by a precharge signal BL_PR and a reference bitline precharge signal RBL_PR, before a read operation.

When the read operation starts, the reference plate line RPL is enabled for a predetermined time and is then disabled by a first control signal when the reference word line RSWL1 connected to one of the reference cells RC is enabled. At this time, the word line SWL0 of one of the memory cells MC may be enabled or disabled. A main bit line BL0 connected to the memory cell MC exists in a state where the precharge signal BL_PR is disabled and the reference bit line precharge signal RBL_PR connected to one of the reference cells RC is enabled, thus one of the reference cells RC is connected to a sub bit line BL1 precharged by a ground power source. For example, the reference cell RC performs a re-storing operation for storing data '0' first stored in the reference cell RC before sensing data of one of the memory cells MC. (See section '0').

A cycle time in a general ferroelectric memory device is about 100 ns. Similar to the exemplary embodiment of the invention, an operation for writing data '0' in a ferroelectric capacitor constituting a reference cell is performed, and then, data therein is immediately sensed. After re-storing the data to the reference cell, a reference voltage is generated to start the data read operation for a memory cell within a time of decades of nanoseconds, and in this time a relaxation effect may occur. In accordance with the exemplary embodiment of the invention, however, at such a data sensing point in a memory cell, the relaxation effect or imprint effect can be prevented or substantially reduced.

For example, a general read operation starts with a second control signal after the re-storing operation. If the word line SWL0 is not selected in the re-storing operation, the main word line signal MWL0 and the word line selection signal S0 are enabled and applied, selecting the word line SWL0 for the word line decoder and driver circuit 210. Further, main sense amplifier and sub sense amplifier path signals SA_PATH and RSA_PATH are enabled to connect the bit line pairs BL0, BL1 and BL2, BL3 with their respective sense amplifiers S/A. The reference bit line precharge signal RBL_PR of a sub bit line connected to a reference cell is then disabled. (See section 'I').

A plate line voltage is applied to the plate line PL0 connected to a selected memory cell MC, and a reference plate line voltage is applied to the reference plate line RPL. Subsequently, a voltage corresponding to data of a selected main memory cell, data "0" or data "1", is excited to a main bit line BL and BL0 and a reference voltage is excited to a sub bit line BL1 and BLB connected to one of the reference cells RC. (See section 'II').

Next, a voltage difference of bit lines BL0 and BL1 is sensed and amplified in response to a sense enable signal SAEN in the sense amplifier S/A. When data "0" is sensed by an amplification operation of the sense amplifier S/A, a voltage of the main bit line BL becomes a ground voltage and a voltage of sub bit line BLB has a level of a power source voltage. When data "1" is sensed, a voltage of the main bit line BL has a level of the power source voltage and a voltage of the sub bit line BLB has a level of the power source voltage. (See section 'III').

After applying the sense amplifier enable signal SAEN, data is sensed and then the sub sense amplifier path signal RSA_PATH is disabled to cut off the sense amplifier SA and its complementary bit line BL1. A sub bit line precharge signal RBL_PR is enabled to ground the sub bit line BL1, thus preventing a data reverse effect of a selected reference cell RC. (See section 'IV').

When the data reading is completed in the sense amplifier S/A, one of the main memory cells MC returns to a first data state in conformity with the read data. (See section 'V').

When the word line selection signal S1 is selected instead of the word line selection signal S0, the main bit line BL becomes the bit line BL1, to excite data of one of the main memory cells MC, and the bit line BL0 becomes the sub bit line BL to excite a reference voltage.

Figure 1:
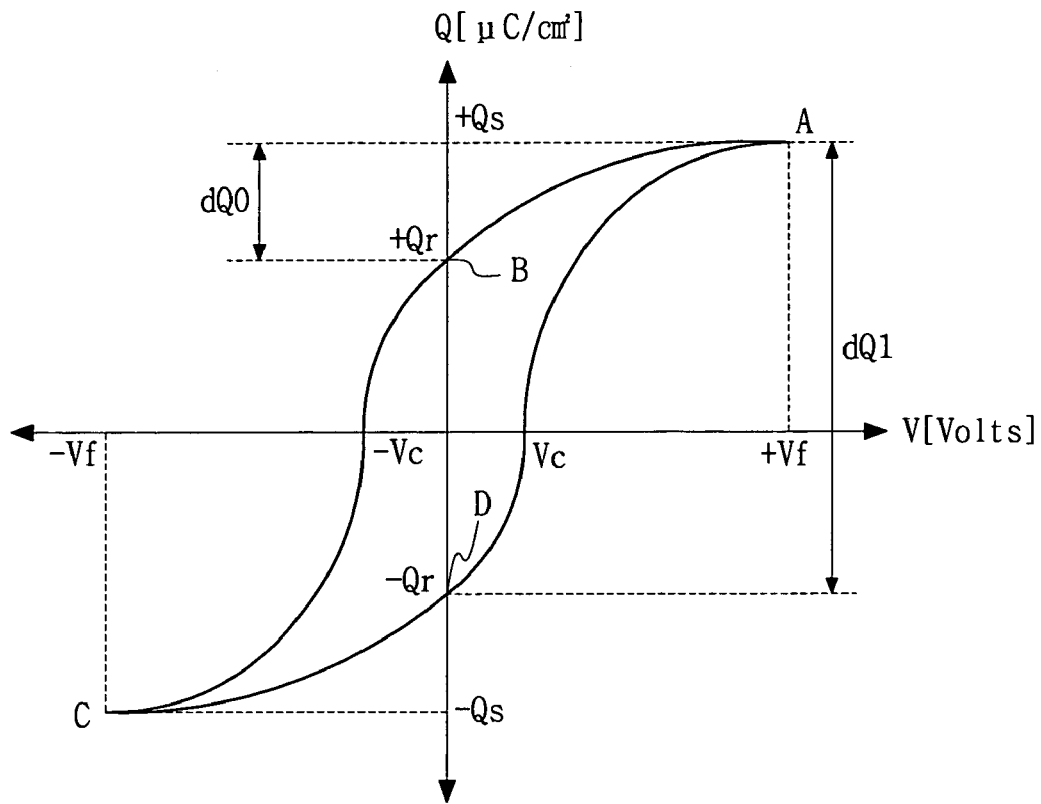
FIG. 1 illustrates a hysteresis curve for a general ferroelectric material.

Although an exemplary embodiment of the invention describes that data '0' corresponds to the state point B of the hysteresis loop shown in FIG. 1 and data '1' corresponds to the state point D of the hysteresis loop shown in FIG. 1, the ferroelectric memory device may be configured such that data '1' corresponds to the state point B and data '0' corresponds to the state point D. In addition, although the above description uses the non-switching area of a ferroelectric capacitor, a mid value between a non-switching capacitance and a switching capacitance of a ferroelectric capacitor may be used for generating a reference voltage.

According to an exemplary embodiment of the invention, a stabilized reference voltage can be generated through a data re-storing operation of a reference cell before a general read operation. Additionally, a relaxation or imprint effect of a ferroelectric capacitor constituting a reference cell can be prevented or substantially reduced, thereby enhancing the reliability of a memory device.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A method of driving a reference voltage generating apparatus for supplying a reference voltage to read data from a ferroelectric memory cell including a ferroelectric capacitor and an access transistor, the method comprising:
   re-storing, in a reference cell, data equal to data stored in the reference cell, in response to a first control signal; and
   generating a reference voltage, in the re-stored reference cell, in response to a second control signal, to compare the reference voltage with a voltage corresponding to data stored in the ferroelectric memory cell and to read the data stored in the ferroelectric memory cell,
   wherein the reference cell comprises: a ferroelectric capacitor and an access transistor, the ferroelectric capacitor in the reference cell is larger than the ferroelectric capacitor in the ferroelectric memory cell.

2. The method of claim 1, wherein the reference voltage is generated in a non-switching area of the ferroelectric capacitor in the reference cell.

3. The method of claim 1, wherein the step of re-storing the data in the reference cell is performed before enabling an excitation control signal in which data stored in the memory cell is excited to a bit line connected to the memory cell.

4. The method of claim 3, wherein the excitation control signal is applied through a plate line connected to the memory cell.

5. The method of claim 3, wherein the step of re-storing the data in the reference cell comprises:
   enabling a reference word line connected to the reference cell when a bit line connected to the reference cell is grounded; and
   applying a pulse to a reference plate line connected to the reference cell.

6. The method of claim 5, wherein the reference voltage is generated in the reference cell when data in the memory cell is excited to the bit line connected to the memory cell and is simultaneously excited to the bit line connected to the reference cell.

7. An apparatus for generating a reference voltage to read data from a ferroelectric memory cell including a ferroelectric capacitor and a transistor, the apparatus comprising:
   a reference cell array having a plurality of reference cells each of the plurality of reference cells including a ferroelectric capacitor and a transistor;
   a plurality of reference word lines respectively connected to the transistors in the plurality of reference cells;
   a plurality of bit lines respectively connected to the plurality of reference cells;
   a plurality of reference plate lines respectively connected to the ferroelectric capacitors in the plurality of reference cells; and
   a reference voltage generating circuit for re-storing, in at least one of the plurality of reference cells, data equal to data stored in the at least one of the plurality of reference cells, in response to a first control signal, and for generating a reference voltage in at least one of the re-stored reference cells in response to a second control signal, and for comparing the reference voltage with a voltage corresponding to data stored in the ferroelectric memory cell and for reading the data stored in the ferroelectric memory cell.

8. The apparatus of claim 7, wherein the transistor in each of the plurality of reference cells is an access transistor.

9. The apparatus of claim 7, wherein the ferroelectric capacitor in the reference cell is larger than the ferroelectric capacitor in the memory cell.

10. The apparatus of claim 7, wherein the reference voltage is generated in a non-switching area of the ferroelectric capacitor in the reference cell.

11. The apparatus of claim 7, wherein the reference voltage generating circuit comprises a drive circuit for performing one of an enabling and disabling one of the plurality of reference plate lines and bit lines connected to one of the plurality of reference word lines and reference cells in response to a read start signal.

12. The apparatus of claim 7, wherein the reference voltage generated in one of the plurality of reference cells is generated when data in the ferroelectric memory cell is excited to a bit line connected to the ferroelectric memory cell and is simultaneously excited to a bit line connected to one of the plurality of reference cells.

13. A method of generating a stable reference voltage in a reference cell to read data from a ferroelectric memory cell, comprising:
   storing second data in the reference cell, wherein the second data is equal to first data previously stored in the reference cell;
   generating the stable reference voltage in the reference cell with the second data;
   sensing a voltage of the ferroelectric memory cell;
   comparing the voltage of the ferroelectric memory cell with the stable reference voltage; and
   reading the data in the ferroelectric memory cell.

14. The method of claim 13, wherein the ferroelectric memory cell includes a ferroelectric capacitor and an access transistor.

15. The method of claim 13, wherein the reference cell includes a ferroelectric capacitor and an access transistor.

16. The method of claim 13, wherein a ferroelectric capacitor in the reference cell is larger than a ferroelectric capacitor in the ferroelectric memory cell.

17. The method of claim 13, wherein the voltage of the ferroelectric memory cell is sensed, the voltage of the ferroelectric memory cell is compared with the stable reference voltage, and the data in the ferroelectric memory cell is read by a sense amplifier.

18. The method of claim 13, wherein the stable reference voltage reduces one of an imprint effect and a relaxation effect of the reference cell.

19. A method of driving a reference voltage generating apparatus for supplying a reference voltage to read data from a ferroelectric memory cell including a ferroelectric capacitor and an access transistor, the method comprising:
   re-storing, in a reference cell, data equal to data stored in the reference cell, in response to a first control signal; and
   generating a reference voltage, in the re-stored reference cell, in response to a second control signal, to compare the reference voltage with a voltage corresponding to data stored in the ferroelectric memory cell and to read the data stored in the ferroelectric memory cell,
   wherein the step of re-storing the data in the reference cell is performed before enabling an excitation control signal in which data stored in the memory cell is excited to a bit line connected to the memory cell.

20. A method of driving a reference voltage generating apparatus for supplying a reference voltage to read data from a ferroelectric memory cell including a ferroelectric capacitor and an access transistor, the method comprising:
   re-storing, in a reference cell, data equal to data stored in the reference cell, in response to a first control signal; and
   generating a reference voltage, in the re-stored reference cell, in response to a second control signal, to compare the reference voltage with a voltage corresponding to data stored in the ferroelectric memory cell and to read the data stored in the ferroelectric memory cell,
   wherein the reference cell comprises: a ferroelectric capacitor and an access transistor, the reference voltage is generated in a non-switching area of the ferroelectric capacitor in the reference cell.

* * * * *